(12) United States Patent
Kuo

(10) Patent No.: US 7,521,298 B2
(45) Date of Patent: Apr. 21, 2009

(54) THIN FILM TRANSISTOR ARRAY PANEL OF ACTIVE LIQUID CRYSTAL DISPLAY AND FABRICATION METHOD THEREOF

(75) Inventor: Chien-Chung Kuo, Fongyuan (TW)

(73) Assignee: Wintec Corporation, Taichung County (TW)

( * ) Notice: Subject to any disclaimer, the term of this patent is extended or adjusted under 35 U.S.C. 154(b) by 174 days.

(21) Appl. No.: 11/563,196

(22) Filed: Nov. 25, 2006

(65) Prior Publication Data

US 2008/0121885 A1   May 29, 2008

(51) Int. Cl.
*H01L 21/00* (2006.01)

(52) U.S. Cl. ............... 438/149; 438/128; 438/587; 438/982; 438/FOR. 184; 438/FOR. 201; 257/E29.151; 257/E51.005

(58) Field of Classification Search ......... 438/128, 438/149, 587, 982, FOR. 184, FOR. 201; 257/E29.151, E51.005
See application file for complete search history.

(56) References Cited

U.S. PATENT DOCUMENTS

| | | | |
|---|---|---|---|
| 4,624,737 A | 11/1986 | Shimbo | |
| 6,184,069 B1 * | 2/2001 | Wu | 438/155 |
| 2003/0189175 A1 * | 10/2003 | Lee et al. | 250/370.08 |
| 2004/0252272 A1 * | 12/2004 | Takatori et al. | 349/179 |
| 2005/0170564 A1 * | 8/2005 | Lai | 438/149 |
| 2005/0269942 A1 * | 12/2005 | Ahn et al. | 313/503 |
| 2006/0033862 A1 * | 2/2006 | Huang et al. | 349/110 |
| 2006/0141643 A1 * | 6/2006 | Shih | 438/22 |
| 2006/0186409 A1 * | 8/2006 | Horino et al. | 257/59 |
| 2006/0202934 A1 * | 9/2006 | Shin et al. | 345/95 |

* cited by examiner

*Primary Examiner*—Thanh V Pham
(74) *Attorney, Agent, or Firm*—Apex Juris, pllc; Tracy M Heims

(57) ABSTRACT

A thin film transistor (TFT) array panel structure and a fabrication method thereof are provided. The method includes the following steps. An insulating substrate is provided, on which a first metal layer is deposited to form a plurality of gate electrodes, a plurality of lower electrodes of storage capacitors, a plurality of scan lines, and a plurality of scan line pads with a first mask process. A TFT island region is formed with a second mask process. Drain electrodes and source electrodes of the TFT, upper electrodes of storage capacitors, pixel electrodes, data lines and data line pads are formed, and a plurality of pixel display regions is defined with a third mask process. The pattern of a passivation layer is defined with a fourth mask. A second metal layer in the pixel display region is removed by selective etching.

13 Claims, 8 Drawing Sheets

THIN FILM TRANSISTOR ARRAY PANEL OF ACTIVE LIQUID CRYSTAL DISPLAY AND FABRICATION METHOD THEREOF

BACKGROUND OF THE INVENTION

1. Field of Invention

The present invention relates to an LCD panel, and more particularly to a thin-film-transistor (TFT) array panel structure and a fabrication method thereof.

2. Related Art

TFTs are widely used in display pixel drive of active matrix LCDs. In general, the method of fabricating a TFT array panel of an active matrix LCD must include five mask processes. Firstly, a first metal layer is deposited on an insulating substrate (for example, a glass substrate) which serves as a display panel, and a gate electrode, a lower electrode of a storage capacitor, a scan line, and a scan line pad are formed with a first mask. Then, a gate insulator layer, an a-Si layer, and an N+ a-Si layer are sequentially deposited on the first metal layer, and the a-Si layer and N+ a-Si layer are defined as TFT islands with a second mask. Thereafter, a second metal layer is deposited on the N+ a-Si layer and the gate insulator layer. Next, a channel is formed with a third mask and back-channel etching (BCE), so as to define a pair of drain/source electrodes, an upper electrode of a storage capacitor, a data line, a data line pad, and a pixel display region. Afterward, a passivation layer, for example, a nitride is deposited to protect the transistor and the storage capacitor structure, the pattern of the passivation layer is defined with a fourth mask, and a contact hole is formed. Finally, a transparent electrode layer, for example, indium tin oxide (ITO) is deposited on the passivation layer, and the pattern of a pixel electrode is defined with a fifth mask. The drain electrode is electrically connected to the pixel electrode via the contact hole formed by the passivation layer.

To reduce the number of the masks used, U.S. Patent Publication U.S. Pat. No. 4,624,737 proposes a fabrication method of TFT, which includes the following steps. (1) Form a gate electrode on an insulating substrate. (2) Forming a gate insulator layer, a high-impedance semiconductor layer, a low-impedance semiconductor layer, and a conductor layer sequentially on the substrate, and etching the high-impedance semiconductor layer, low-impedance semiconductor layer, and conductor layer to form an island region thereabove. (3) Etching the low-impedance semiconductor layer and the conductor layer, such that the two layers are fractured to form a source electrode and a drain electrode respectively. (4) Forming a passivation layer and etching the passivation layer, such that the passivation layer covers the source electrode and drain electrode of the TFT.

The aforementioned transistor structure can be applied in a transmissive LCD or a reflective LCD. When applied in a transmissive TFT LCD panel, the conductor layer of the transistor structure must adopt materials such as ITO as transmissive conductors, i.e., the data line of the transmissive LCD is formed by ITO. As the impedance of the ITO is higher than a general metal conductor, the signal is easily distorted when transmitted through the data line, and thus the operating frequency of the pixel of the LCD panel is negatively affected and the response rate cannot be easily accelerated. Moreover, when the aforementioned transistor structure is applied in a transmissive LCD or a reflective LCD, a suitable metal conductor must be selected to avoid the poor bonding when the pads of the LCD are bonded to other electronic components.

Further, in the aforementioned method of fabricating TFT array panel with five masks, the second metal layer serving as the upper electrode of a storage capacitor is made of an opaque material. In process, in order to overlap the second metal layer and the first metal layer to form a storage capacitor structure, based on the consideration of process tolerance, the second metal layer of the upper electrode of the storage capacitor is larger in area than the first metal layer of the lower electrode, which usually results in a low aperture ratio.

SUMMARY OF THE INVENTION

In the conventional art, the fabricating processes of TFT array panel is complex and requires several masks, so it difficult to improve the yield and productivity. In addition, when the TFT disclosed in the U.S. Patent Publication U.S. Pat. No. 4,624,737 is applied in a transmissive LCD panel, the conductor layer must be made of a high-impedance ITO material, thus resulting in the signal distortion and the difficulty in accelerating the responsing rate. When applied in a transflective LCD panel, it is hard to regulate the optical characteristics of the transmissive region and the reflective region. Moreover, in the conventional art, due to the process, the aperture ratio is often low and the pad bonding is poor. In view of the above problems, the present invention is mainly directed to provide a TFT array panel structure and a fabrication method thereof for simplifying the process and eliminating the signal distortion in transmission in the prior art.

The present invention is also directed to provide a TFT array panel structure and a fabrication method thereof for easily regulating the optical characteristics of the transmissive region and reflective region and solving the problems of low aperture ratio and poor pad bonding existing in the prior art.

To solve the above problems, the present invention provides a method of fabricating the TFT array panel of an active matrix LCD, which comprises the following steps. Firstly, an insulating substrate is provided, on which a first metal layer is deposited, and a plurality of gate electrodes of the TFT, a plurality of lower electrodes of storage capacitors, a plurality of scan lines, and a plurality of scan line pads are formed with a first mask process by lithography process and etching process. Then, a gate insulator layer, an a-Si layer, and an N+ a-Si layer are sequentially formed on the first metal layer, wherein the a-Si layer and the N+ a-Si layer form an island region corresponding to the gate electrode with a second mask process by lithography process and etching process. Afterward, a transparent electrode layer and a second metal layer are sequentially deposited, and the patterns of the transparent electrode layer and the second metal layer on the gate electrode are defined with a third mask process by lithography process and etching process, so as to form a plurality of drain electrodes of the TFT, a plurality of source electrodes of the TFT, a plurality of upper electrodes of storage capacitors, a plurality of pixel electrodes, a plurality of data lines, and a plurality of data line pads. Meanwhile, a plurality of pixel display regions is formed by interlaced scan lines and data lines, and the N+ a-Si layer in the TFT island region is fractured at the middle by BCE with the second metal layer as an etching mask to correspond to a drain electrode and a source electrode. Next, a passivation layer is formed to cover the second metal layer, the a-Si layer, and the gate insulator layer, wherein a fourth mask process is employed to define the pattern of the passivation layer and remove the passivation layer in the pixel display regions by lithography process and etching process. Finally, the second metal layer in the pixel display regions is removed by selective etching, so as to form transmissive regions.

With the above fabrication method, the present invention further provides a TFT array panel structure applicable to an LCD panel, which comprises an insulating substrate, a plurality of TFTs, a plurality of storage capacitors, a plurality of scan lines, a plurality of data lines, a plurality of pixel display regions, and a plurality of pads. The TFTs are formed on the insulating substrate, and of a stack structure which comprises a gate electrode, a drain electrode, and a source electrode. The gate electrode is formed on the insulating substrate, and a gate insulator layer covers the gate electrode. The drain electrode and the source electrode, formed opposite to each other on the gate insulator layer, respectively have a sequentially stacked a-Si layer, N+ a-Si layer, transparent electrode layer, and second metal layer. The storage capacitors are formed on the insulating substrate. Each storage capacitor comprises a lower electrode, a gate insulator layer, and an upper electrode, wherein the lower electrode is formed on the insulating substrate, the gate insulator layer covers the lower electrode, and the upper electrode is formed on the gate insulator layer. However, the scan lines and data lines for transmitting electric signals are respectively connected to the gate electrodes and source electrodes, and are interlaced to define the pixel display regions. The pixel display regions are covered by the transparent electrode layer that forms the pixel electrode, so as to display images. The scan lines and data lines perform the transmission of the electric signals, and are connected to other electronic components via the pads formed on the insulating substrate. Moreover, the transparent electrode layer in the structure contacts the second metal layer to form drain the electrodes, the source electrodes, and the external signal wires. Thus, with the decrease of impedance of the second metal layer, the operating frequency of the LCD panel can be improved.

The efficacy of the present invention lies in that with the arrangement of those structure layers, the structure layers formed above can be used as etching masks to etch the structures therebeneath, and the regions not covered by certain structural layers can be etched with selective etching, such that the number of the masks used can be reduced. Meanwhile, the second metal layer is used to replace the transparent electrode layer as a signal wire of the TFT, thus effectively reducing the impedance and noises, improving the operating frequency of the TFT, and simplifying the process and reducing the number of the masks.

The detailed features and advantages of the present invention will be described in detail in the following embodiments. Those skilled in the arts can easily understand and implementation the content of the present invention. Furthermore, the relative objectives and advantages of the present invention are apparent to those skilled in the arts with reference to the content disclosed in the specification, claims, and drawings.

The above description of the content of the present invention and the following illustration of the embodiments are intended to demonstrate and explain the principle of the present invention and to provide further explanations of the claims of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The objectives, structures, features, and functions of the present invention will be illustrated in detail below accompanied with the embodiments.

Referring to FIGS. 1A to 5, schematic sectional views of a TFT array panel of an active matrix LCD according to the first embodiment of the present invention are shown. The fabricating flow of the TFT array panel is disclosed and the details of the processes are illustrated as follows.

Figure 1A:
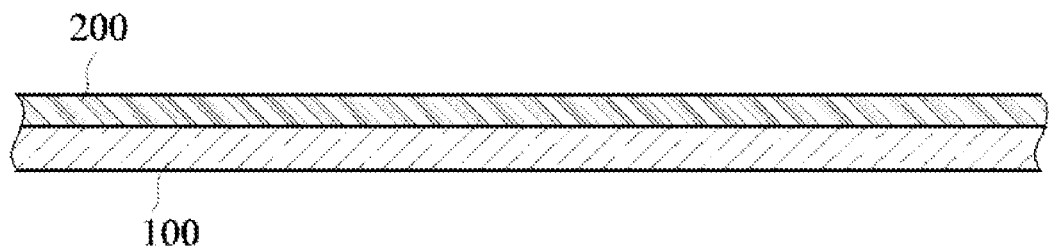
FIGS. 1A and 1B are schematic views of the first mask process according to the first embodiment of the present invention.
Figure 1B:
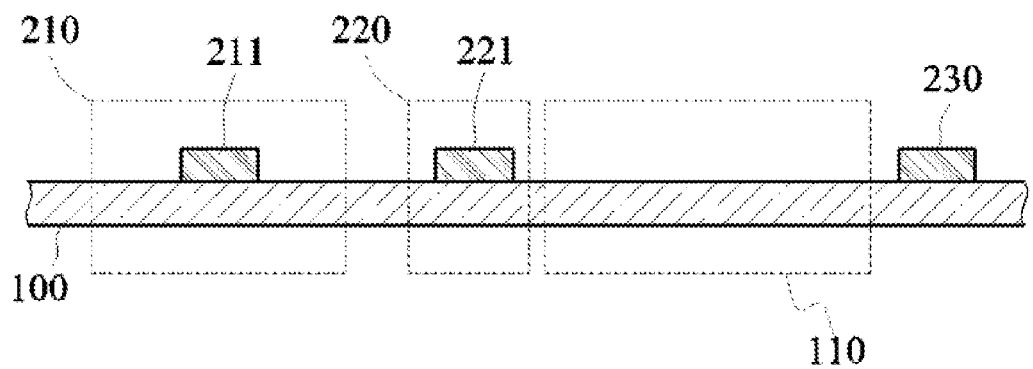

As shown in FIGS. 1A and 1B, the first mask processes of the present invention are illustrated. Firstly, an insulating substrate 100 is provided, and a first metal layer 200 is formed on the insulating substrate 100 by deposition or sputtering. Then, a first mask is used to perform lithography process and etching process on the first metal layer 200, thus forming a gate electrode 211 of a TFT 210, a lower electrode 221 of a storage capacitor 220, a scan line (not shown), and a scan line pad 230 on the insulating substrate 100. Meanwhile, the profile of a pixel display region 110 is formed.

The insulating substrate 100 is made of a transparent material, such as glass, quartz, ceramic, or plastic substrates. The first metal layer 200 is firstly formed on the insulating substrate 100, and the undesired parts are removed by lithography process and etching process by the use of the first mask, thus forming the gate electrode 211, lower electrode 221, scan line pad 230, and scan line.

Figure 2A:
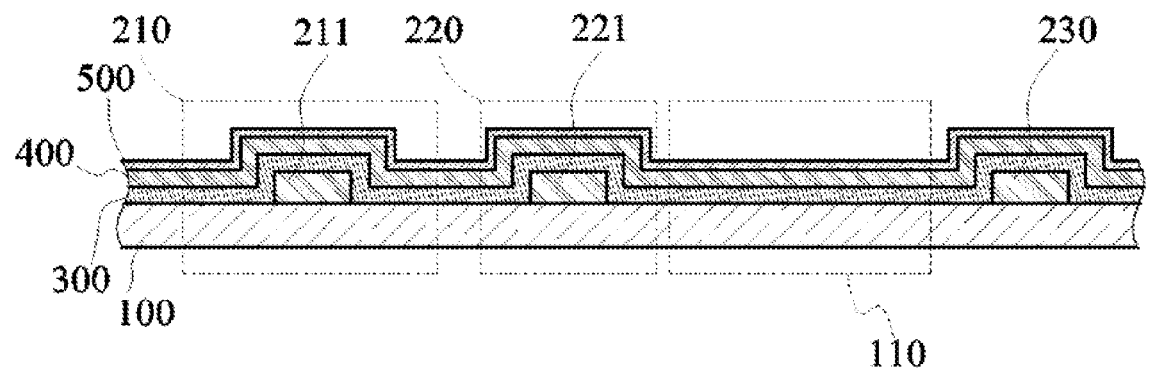
FIGS. 2A and 2B are schematic views of the second mask process according to the first embodiment of the present invention.
Figure 2B:
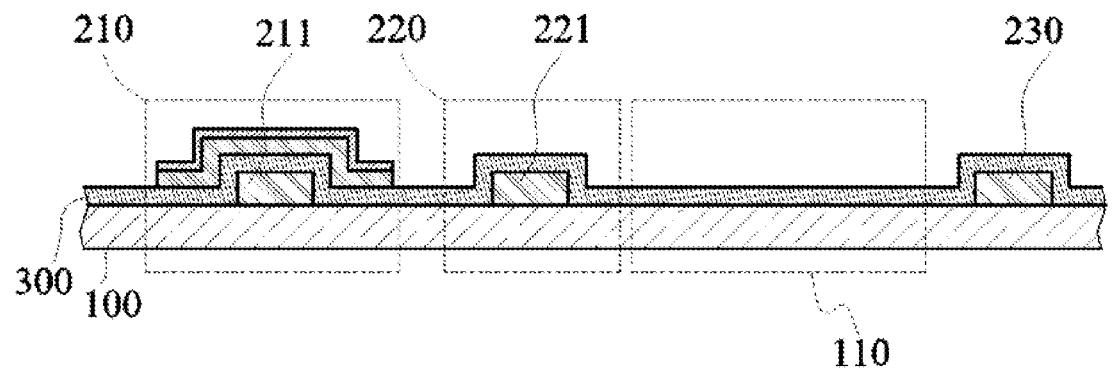

As shown in FIGS. 2A and 2B, the second mask process of the present invention is illustrated. A gate insulator layer 300, an a-Si layer 400, and an N+ a-Si layer 500 are sequentially formed on the insulating substrate 100 by deposition or film coating. Moreover, the above layers cover the gate electrode 211, lower electrode 221, pixel display region 110, and pad 230. The patterns of the a-Si layer 400 and N+ a-Si layer 500 are formed by lithography process and etching process by the use of a second mask. Only the portions of the a-Si layer 400 and N+ a-Si layer 500 above the gate electrode 211 are reserved and constitute a semiconductor island region.

Figure 3A:
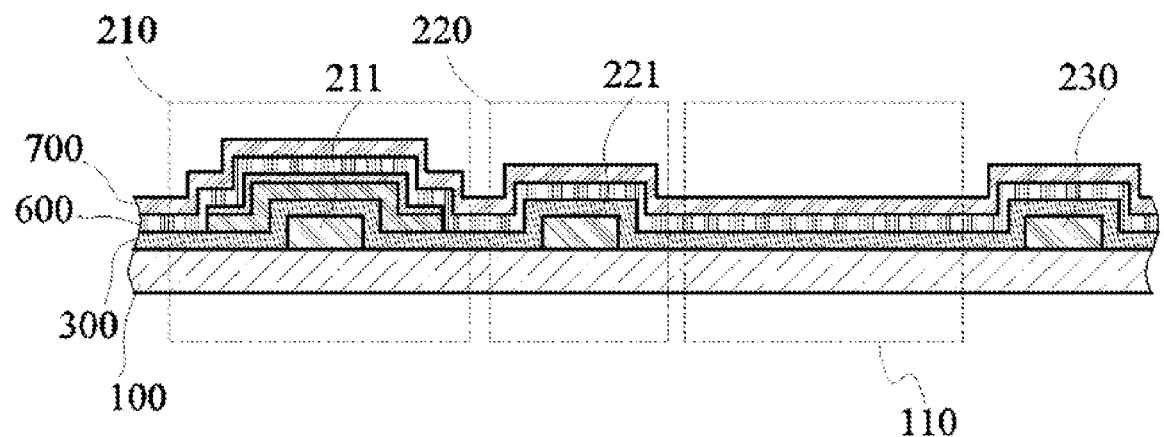
FIGS. 3A, 3B, and 3C are schematic views of the third mask process according to the first embodiment of the present invention.
Figure 3B:
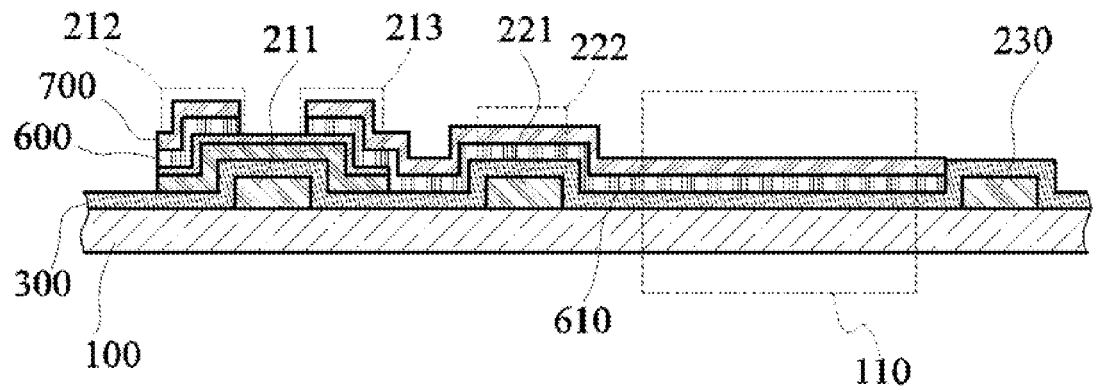

As shown in FIGS. 3A and 3B, the third mask process of the present invention is illustrated. Firstly, a transparent electrode layer 600 and a second metal layer 700 are sequentially formed on the abovementioned substrate. The transparent electrode layer 600 is made of a transparent and conductive material, such as ITO, and the electrical conductivity of the second metal layer is higher than that of the transparent electrode layer 600. The transparent electrode layer 600 and the second metal layer 700 are etched with a third mask, thus forming a source electrode 212 of the TFT 210, a drain electrode 213 of the TFT 210, an upper electrode 222 of the storage capacitor, a pixel electrode 610 of the pixel display region 110, a data line, and a data line pad. The source electrode 212 and drain electrode 213 are formed by the fracture of the second metal layer 700 and the transparent electrode layer 600 above the gate electrode 211 at the middle by the use of the third mask.

Figure 3C:
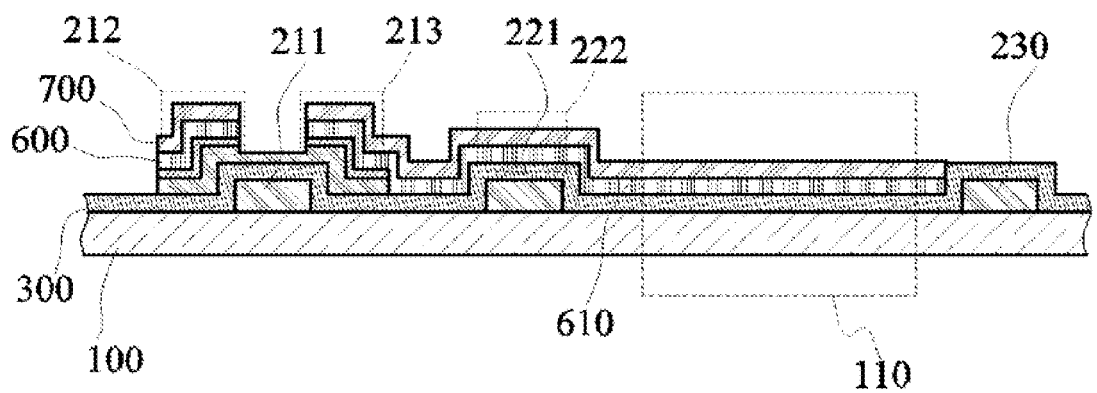

As shown in FIG. 3C, the second metal layer 700 functions as an etching mask to fracture the N+ a-Si layer 500 between the source electrode 212 and the drain electrode 213 without the arrangement of a mask. Usually, in order to ensure the complete fracture of the N+ a-Si layer 500, the a-Si layer 400 must be somewhat etched, i.e., the BCE process.

The gate electrode 211 formed by the first metal layer 200, and the source electrode 212 and drain electrode 213 formed by the second metal layer 700 constitute the TFT 210 for controlling the display pixels. The second metal layer 700 is directly formed on the transparent electrode layer 600, thus reducing the impedance during the transmission of the electric signals through data lines.

Figure 4A:
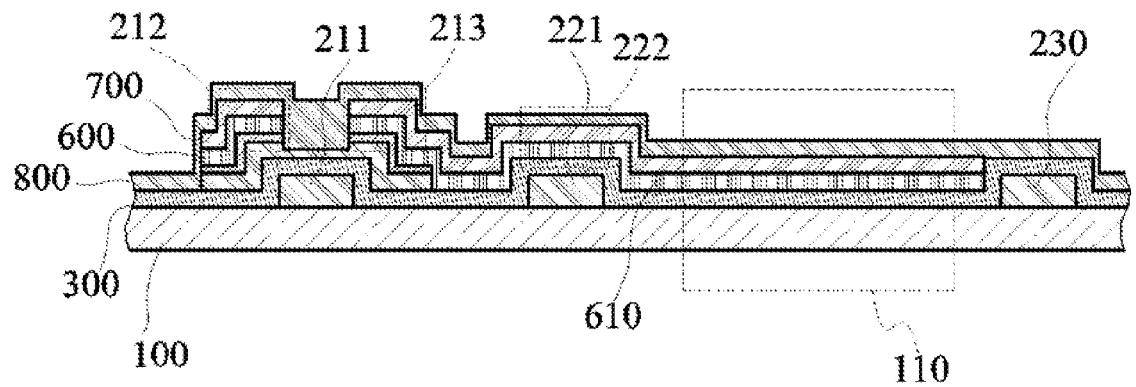
FIGS. 4A and 4B are schematic views of the fourth mask process according to the first embodiment of the present invention.
Figure 4B:
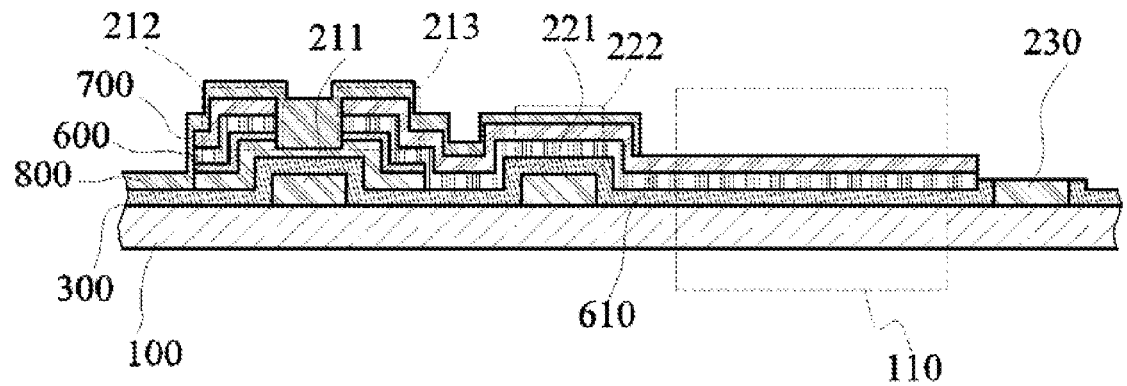

As shown in FIGS. 4A and 4B, the fourth mask process of the present invention is illustrated. Firstly, a passivation layer 800 is formed and covers various elements formed by the gate insulator layer 300, second metal layer 700, and a-Si layer 400. Then, the passivation layer 800 located above the TFT 210 and storage capacitor 220 is reserved with the rest portions removed by the use of a fourth mask, such that the passivation layer 800 can protect the TFT 210 and storage capacitor 220. Meanwhile, the gate insulator layer 300 located above the scan line pad 230 is removed with a photoresist and the second metal layer 700 as the etching mask by lithography process and etching process, and thus the metal of the scan line pad 230 is exposed.

Figure 5:
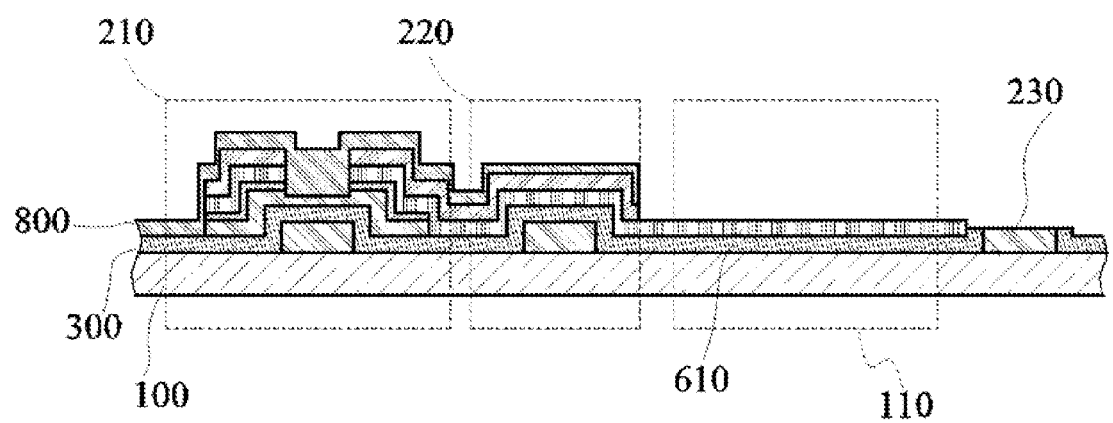
FIG. 5 is a schematic sectional view of the TFT according to the first embodiment of the present invention.

As shown in FIG. 5, a schematic sectional view of the TFT array panel according to the first embodiment of the present invention is shown. The passivation layer 800 is used to protect the TFT 210 and the storage capacitor 220. The second metal layer 700 located above the pixel display region 110, i.e., covering the pixel electrode 610 is removed and the transparent electrode layer 600 constituting the pixel electrode 610 is reserved, such that lights can pass through the pixel display region 110. Therefore, the TFT array panel provided by the present invention is applicable to the pixels of a transmissive LCD panel for driving the liquid crystal in the pixels to make different displays. Moreover, the step of removing the second metal layer 700 can be omitted, and the TFT 210 is applicable to a reflective LCD panel.

Based on the above combinations, the present invention can be used to fabricate a TFT array panel which is applicable to an active matrix LCD, and includes an insulating substrate 100, a plurality of TFTs 210, a plurality of storage capacitors 220, a plurality of pixel display regions 110, a plurality of scan lines and a plurality of data lines, a plurality of scan line pads 230 and a plurality of data line pads.

Each TFT 210 includes a gate electrode 211, a source electrode 212, and a drain electrode 213. The gate electrode 211 is formed on the insulating substrate 100, and is covered by a gate insulator layer 300. The source electrode 212 is formed on the gate insulator layer 300 and is constituted by an N+ a-Si layer 500, a transparent electrode layer 600, and a second metal layer 700 sequentially stacked. The drain electrode 213 is also formed on the gate insulator layer 300, and spaced from the source electrode 212 for a distance and is opposite to the source electrode 212. In addition, the drain electrode 213 is constituted by an N+ a-Si layer 500, a transparent electrode layer 600, and a second metal layer 700 sequentially stacked.

Moreover, each storage capacitor 220 of the TFT array panel is constituted by a lower electrode 221, an upper electrode 222, and a gate insulator layer 300 between the lower electrode 221 and the upper electrode 222. The lower electrode 221 is formed by the first metal layer 200 disposed on the insulating substrate 100. The aforementioned gate insulator layer 300 covers the lower electrode 221, and then is covered by a transparent electrode layer 600. The upper electrode 222 is formed by the transparent electrode layer 600 and the second metal layer 700 covered on the gate insulator layer 300. Furthermore, the upper electrode 222 and the TFT 210 are conducted via the second metal layer 700.

The scan lines formed by the first metal layer 200 and the data lines formed by the second metal layer 700 are interlaced to define the pixel display regions 110 on the insulating substrate 100. The pixel display regions 110 is covered by the pixel electrode 610 formed by the transparent electrode layer 600 for lights to pass through, thus displaying images. Moreover, the scan lines and data lines are connected to other electronic components via the pads formed on the insulating substrate 100.

Figure 6A:
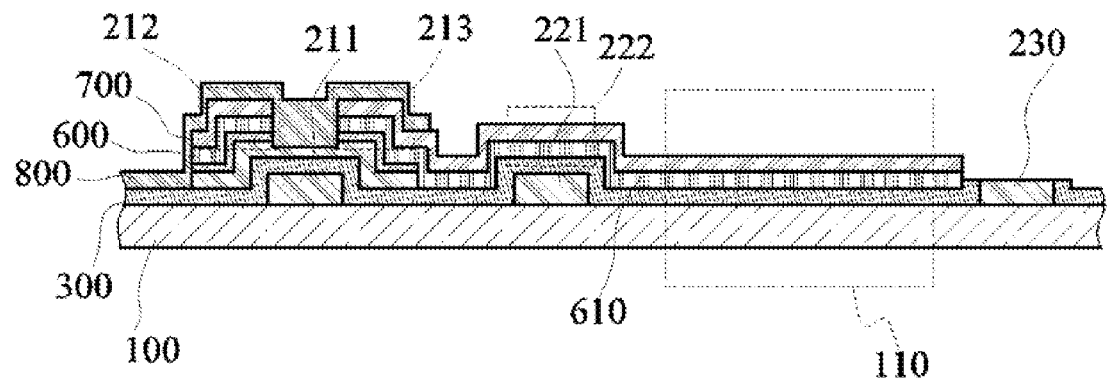
FIGS. 6A and 6B are schematic views of the fourth mask process according to the second embodiment of the present invention.
Figure 6B:
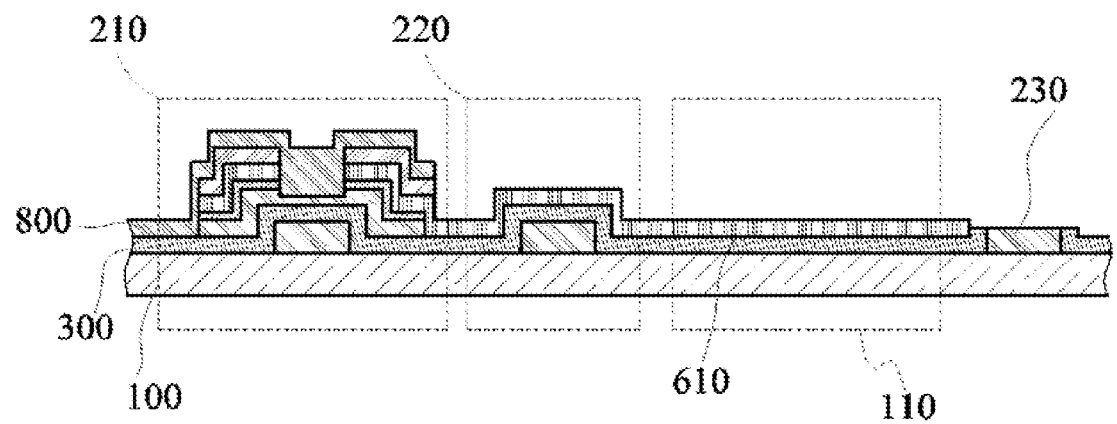

Referring to FIGS. 6A and 6B, schematic sectional views of the TFT array panel of an active matrix LCD according to the second embodiment of the present invention are shown. The fabrication flow of the present embodiment is identical to that of the first embodiment, wherein four mask processes are employed to fabricate the TFT array panel. However, the main difference is that in the fourth mask process, the passivation layer 800 above the storage capacitor 220 is removed by lithography process and etching process and the second metal layer 700 above the storage capacitor 200 is removed by selective etching. As such, the transparent electrode layer 600 serves as the upper electrode 222 of the storage capacitor 200. The upper electrode 222 of the storage capacitor 200 employs the transparent electrode layer 600 instead of the original opaque second metal layer 700, thus eliminating the problem of the low aperture ratio due to the consideration of tolerance in the process, and improving the aperture ratio of the pixel display region 110.

Figure 7A:
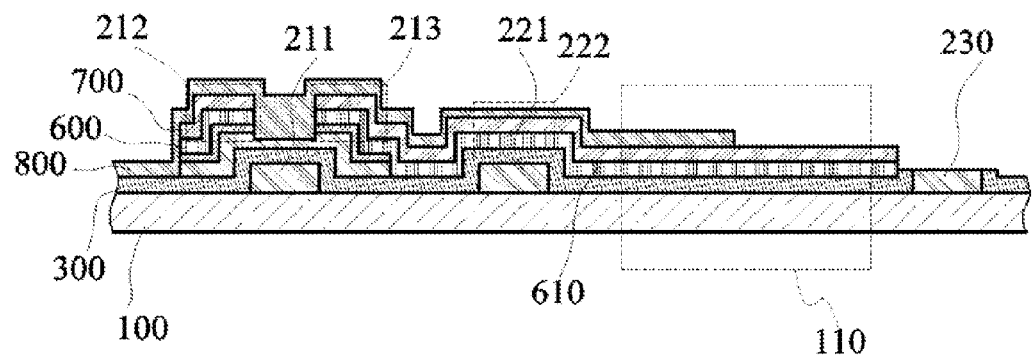
FIGS. 7A and 7B are schematic views of the fourth mask process according to the third embodiment of the present invention.
Figure 7B:
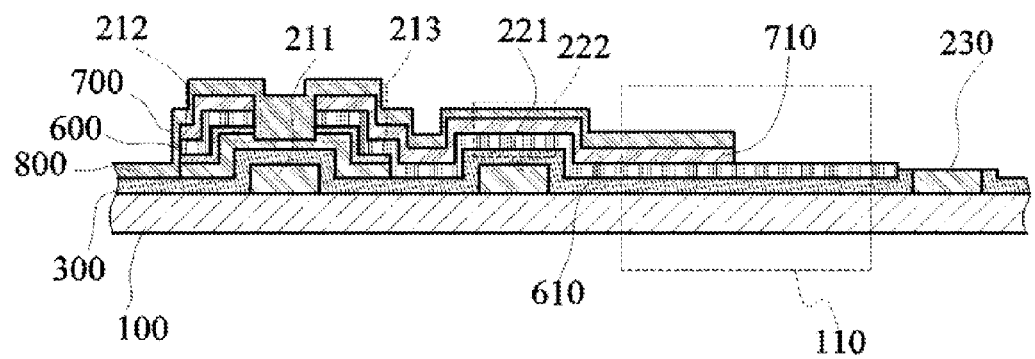

Referring to FIGS. 7A and 7B, schematic sectional views of the TFT array panel of an active matrix LCD according to the third embodiment of the present invention are shown. The main difference between the present embodiment and the first embodiment is that in the fourth mask process, a portion of the passivation layer 800 is reserved in the pixel display region 110. By the use of the passivation layer 800 as a mask, a portion of the second metal layer 700 is reserved in the pixel display region 110 after selective etching. The opaque second metal layer 700 can be used as a reflective electrode 710, such that the pixel display region 110 is divided into a reflective region formed by the reflective electrode 710 and a transmissive region formed by the pixel electrode 610, so as to be applicable to a transflective LCD panel.

Moreover, the thickness of the passivation layer 800 of the pixel display region 110 in the third embodiment can be adjusted to facilitate modulating the thickness of the liquid crystal layer in the transmissive region and the reflective region, thus achieving a preferred V-T relationship diagram (a relationship diagram between voltage and transmission rate) and a preferred V-R relationship diagram (a relationship diagram between voltage and reflectivity) and obtaining the identical phase differences to achieve preferred optical characteristics.

Figure 8A:
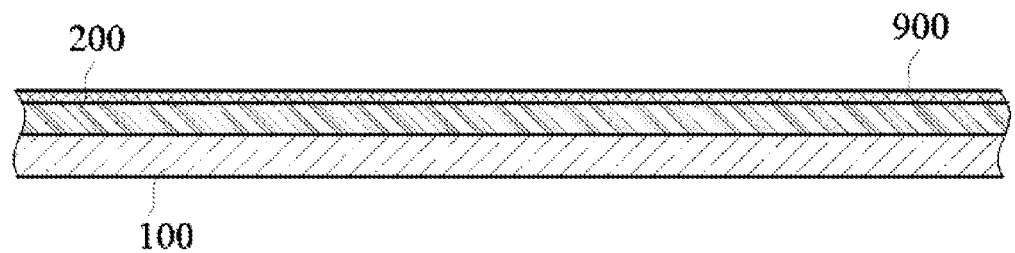
FIGS. 8A and 8B are schematic views of the first mask process according to the fourth embodiment of the present invention.
Figure 8B:
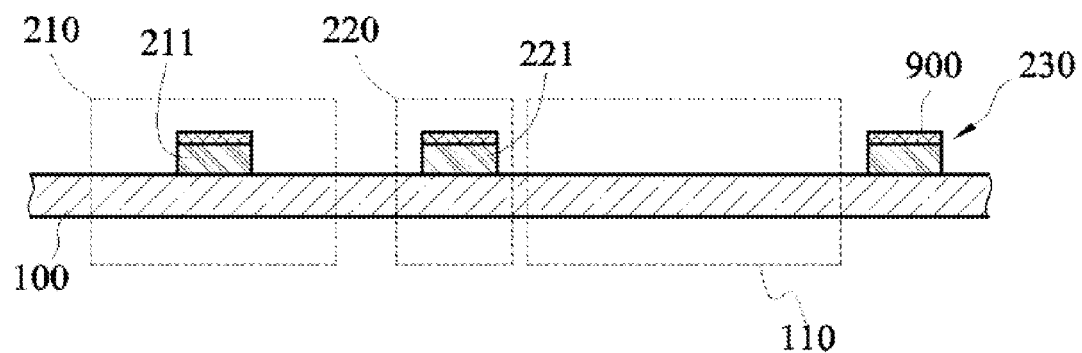

Referring to FIGS. 8A and 8B, schematic sectional views of the TFT array panel of an active matrix LCD according to the fourth embodiment of the present invention are shown. As shown in FIGS. 8A and 8B, the main difference between the present embodiment and the first embodiment is that before the first mask process, a first metal layer 200 and a bonding layer 900 are first sequentially deposited on the insulating substrate 100, wherein the bonding layer 900 is made of a conductive material, such as ITO or indium zinc oxide (IZO). After the first mask process, the bonding layer 900 is formed on the scan line pad 230, such that the scan line pad 230 becomes a composite structure having the first metal layer 200 and the bonding layer 900. With the bonding layer 900 as the contact interface for other electronic components and the first metal layer 200 on the scan line pad 230, the bonding effect between the electronic components and the scan line pad 230 is enhanced.

In the present invention, with the change of the arrangement sequence of various structures, the structure layers firstly formed in the process are used as etching masks and the selective etching is adopted to reduce the number of the masks used. Meanwhile, the scan lines and scan line pads are formed at the same time when the gate electrode is formed. The scan lines and scan line pads can be made of materials of high conductivity, thus effectively reducing the impedance, and noises and improving the operating frequency of the TFT. Further, the process can be simplified and the number of the masks can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a thin film transistor (TFT) array panel, comprising:
   providing an insulating substrate with a first metal layer formed thereon;
   defining a plurality of gate electrodes, a plurality of lower electrodes of storage capacitors, a plurality of scan lines, and a plurality of scan line pads with a first mask;
   forming a gate insulator layer, an a-Si layer, and an N+ a-Si layer on the first metal layer;
   defining patterns of the a-Si layer and the N+ a-Si layer with a second mask to form a plurality of island regions on the gate electrodes;
   forming a transparent electrode layer and a second metal layer on the N+ a-Si layer and the gate insulator layer;
   defining a plurality of drain electrodes, a plurality of source electrodes, a plurality of upper electrodes of storage capacitors, a plurality of pixel electrodes, a plurality of data lines, and a plurality of data line pads with a third mask, wherein the data lines and the scan lines define a plurality of pixel display regions;
   fracturing the N+ a-Si layer between each pair of the drain/source electrodes at the middle with the second metal layer as an etching mask;
   forming a passivation layer to cover the second metal layer, the a-Si layer, and the gate insulator layer; and
   defining a pattern of the passivation layer with a fourth mask, so as to remove the passivation layer for exposing the scan line pads and the data line pads.

2. The method of fabricating the TFT array panel as claimed in claim 1, wherein the pattern of the passivation layer covers the drain electrodes, the source electrodes and the data lines.

3. The method of fabricating the TFT array panel as claimed in claim 2, wherein the upper electrodes of the storage capacitors are formed by the transparent electrode layer.

4. The method of fabricating the TFT array panel as claimed in claim 1, further comprising:
   removing the second metal layer in the pixel display regions by selective etching.

5. The method of fabricating the TFT array panel as claimed in claim 4, wherein the pixel electrodes are formed by the transparent electrode layer.

6. The method of fabricating the TFT array panel as claimed in claim 4, wherein the pattern of the passivation layer defined with the fourth mask partially covers the pixel display regions.

7. The method of fabricating the TFT array panel as claimed in claim 6, wherein each pixel display region comprises a transmissive region and a reflective region, the second metal layer is disposed between the transparent electrode layer of the reflective region and the passivation layer, and the second electrode layer forms a reflective electrode.

8. The method of fabricating the TFT array panel as claimed in claim 7, wherein the thickness of the passivation layer in the pixel display regions is adjusted to modulate the thickness of the liquid crystal layer in the transmissive region and the reflective region, so that the transmissive region and the reflective region has the same optical phase differences.

9. The method of fabricating the TFT array panel as claimed in claim 1, wherein the pattern of the passivation layer defined with the fourth mask covers the storage capacitors, and the upper electrodes of the storage capacitors are formed by the transparent electrode layer and the second metal layer.

10. The method of fabricating the TFT array panel as claimed in claim 1, further comprising:
    forming a bonding layer on the first metal layer, and defining the gate electrodes, the lower electrodes of the storage capacitors, the scan lines, and the scan line pads with the first mask.

11. The method of fabricating the TFT array panel as claimed in claim 10, wherein each scan line pad is a composite structure constituted by the first metal layer and the bonding layer, and the bonding layer is used to enhance the bonding strength between the scan line pad and a circuit element.

12. The method of fabricating the TFT array panel as claimed in claim 11, wherein the bonding layer is made of a conductive material.

13. The method of fabricating the TFT array panel as claimed in claim 12, wherein the conductive material is indium tin oxide (ITO) or indium zinc oxide (IZO).

* * * * *